(12) United States Patent
Kim et al.

(10) Patent No.: US 8,108,592 B2
(45) Date of Patent: Jan. 31, 2012

(54) MEMORY SYSTEM AND WEAR LEVELING METHOD THEREOF

(75) Inventors: Jin-kyu Kim, Seoul (KR); Kyoung-il Bang, Gyeonggi-do (KR); Hyung-gyu Lee, Seoul (KR); Kyu-ho Park, Daejeon-si (KR); Young-woo Park, Daejeon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 359 days.

(21) Appl. No.: 12/385,160

(22) Filed: Mar. 31, 2009

(65) Prior Publication Data

US 2009/0248962 A1 Oct. 1, 2009

(30) Foreign Application Priority Data

Apr. 1, 2008 (KR) .................. 10-2008-0030423

(51) Int. Cl.
*G06F 12/00* (2006.01)
(52) U.S. Cl. ........................................................ 711/103
(58) Field of Classification Search .................... None
See application file for complete search history.

(56) References Cited

U.S. PATENT DOCUMENTS

| 7,653,778 B2* | 1/2010 | Merry et al. ............ 711/103 |
| 2005/0135155 A1 | 6/2005 | Ishimaru et al. |
| 2007/0083698 A1 | 4/2007 | Gonzalez et al. |
| 2007/0147168 A1 | 6/2007 | Pinto et al. |
| 2009/0182936 A1* | 7/2009 | Lee ........................ 711/103 |

* cited by examiner

*Primary Examiner* — Brian Peugh
(74) *Attorney, Agent, or Firm* — Staas & Halsey LLP (57) ABSTRACT

A memory system includes a variable resistance memory configured to input and output data by a first unit and a translation layer for managing the degree of wear of the variable resistance memory by a second unit, different from the first unit.

15 Claims, 7 Drawing Sheets

| LSN | PSN | Shift Count | Write Count |
|---|---|---|---|
| 1 | 15 | 12 | 36 |
| 2 | 7 | 8 | 24 |
| 3 | 2 | 28 | 52 |
| 4 | 27 | 6 | 18 |
| 5 | 4 | 5 | 12 |
| ⋮ | ⋮ | ⋮ | ⋮ |
| n | 38 | 21 | 43 |

| LSN | PSN | Shift Count | Write Count |
|---|---|---|---|
| 1 | 15 | 12 | 36 |
| 2 | 7 | 8 | 24 |
| 3 | 2 | 28 | 52 |
| 4 | 27 | 6 | 18 |
| 5 | 4 | 5 | 12 |
| ... | ... | ... | ... |
| n | 38 | 21 | 43 |

(b)

| LSN | PSN | Shift Count | Write Count |
|---|---|---|---|
| 1 | 15 | 12 | 36 |
| 2 | 7 | 8 | 24 |
| 3 | 4 | 6 | 13 |
| 4 | 27 | 6 | 18 |
| 5 | 2 | 29 | 53 |
| ... | ... | ... | ... |
| n | 38 | 21 | 43 |

MEMORY SYSTEM AND WEAR LEVELING METHOD THEREOF

CROSS-REFERENCE TO RELATED APPLICATIONS

This application claims the benefit under 35 U.S.C. §119(a) of Korean Patent Application No. 10-2008-0030423, filed on Apr. 1, 2008, the disclosure of which is incorporated herein in its entirety by reference.

BACKGROUND

1. Field

The following description relates to a memory system, and more particularly, to a memory system and its wear leveling method.

2. Description of the Related Art

Semiconductor memory devices may be configured to store data information and classified into volatile memory devices and non-volatile memory devices. Non-volatile memory devices don't lose data stored therein even when power is turned off. Since non-volatile memory devices retain data at a low power, they are commonly known and used as a storage medium for portable systems. Non-volatile memory devices may include a flash memory, a Phase change RAM (PRAM), a Ferroelectric RAM (FeRAM), a Magnetic RAM (MRAM), and the like.

A flash memory device may include a plurality of blocks (or, memory blocks), each of which has a plurality of pages. The flash memory device may perform a program operation, a read operation, and an erase operation. The program and read operations are conducted by a page unit, and the erase operation is conducted by a block unit.

In contrast with a disk apparatus, a flash memory device typically performs an erase operation before a program operation. This is because the flash memory device does not support an overwrite function. For example, data of the flash memory device is initialized into '1' via an erase operation and is changed into '0' via a program operation. That is, it is impossible to initialize a part of the data in a page from '0' into '1.' An erase operation has to be previously performed with respect to an entire block in order to initialize data from '0' into '1.'

Each of the memory blocks in a flash memory device has a limited erase count. But, program and erase operations are able to be concentrated on a specific block or blocks of the memory based upon user patterns or data patterns. As is well known in the art, the program and erase operations may wear out the flash memory device. If a wear level increases, a long time is taken to program and erase data, and an error probability is increased. Further, in the case that a wear level becomes serious, data storing ability of unit cells may be lost completely. Thus, it is necessary to level an erase count of each block.

Flash software for managing a flash memory device may adjust degrees of wear of blocks so as to be retained uniformly, which is called wear leveling. In order to extend the life of a flash memory device, program and erase operations have to be performed uniformly with respect to the entire flash memory device. In the case that program and erase operations are focused on a specific portion of a flash memory device, the life of the specific portion may be rapidly reduced. On the other hand, if the program and erase operations are performed uniformly with respect to entire blocks of a flash memory device, the life of the memory may be extended.

In contrast with the flash memory device described above, variable resistance memories such as RRAM, FeRAM, MRAM, and the like, do not require an erase before programming. That is, variable resistance memories may support an overwrite function. Here, in the case of variable resistance memories, stored data may be discriminated according to a resistance of the memory cells. The term "overwriting" denotes that new data is directly stored at memory cells in which data was previously stored. By the overwriting manner, '0' data is changed into '1' data, and '1' data is changed into '0' data. Since a variable resistance memory such as a PRAM performs a write operation by a word unit, it may be worn out by a word unit. As a result, the present inventors have determined that a wear leveling method should take into consideration such a wear characteristic, i.e., one in which wear occurs by a word unit.

SUMMARY

The following description relates to a memory system and a wear leveling method capable of extending memory life without reducing performance.

According to one or more example embodiments, a memory system is provided. The memory system includes a variable resistance memory configured to input and output data by a first unit, and a translation layer for managing the degree of wear of the variable resistance memory by a second unit different from the first unit.

According to one or more example embodiments, a wear leveling method of a memory system is provided. The memory system includes a variable resistance memory having a plurality of segments each including a plurality of words and performing an overwrite operation by a word unit, and a translation layer for leveling the degree of wear of the segments. The wear leveling method includes detecting wear information of each of the segments, and swapping data in the segments according to the detected wear information.

Additional aspects and/or advantages will be set forth in part in the description which follows and, in part, will be apparent from the description, or may be learned by practice of the example embodiments.

It is to be understood that both the foregoing general description and the following detailed description are exemplary and explanatory and are intended to provide further explanation of the example embodiments as claimed.

BRIEF DESCRIPTION OF THE DRAWINGS

These and/or other aspects and advantages will become apparent and more readily appreciated from the following description of example embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. The example embodiments are described below to explain the present disclosure by referring to the figures.

Example embodiments are described more fully hereinafter with reference to the accompanying drawings, in which example embodiments of the present disclosure are shown. The present disclosure may, however, be embodied in many different forms and should not be construed as limited to the example embodiments set forth herein. Rather, these example embodiments are provided so that this disclosure is thorough, and will fully convey the scope of the present disclosure to those skilled in the art. In the drawings, the size and relative sizes of layers and regions may be exaggerated for clarity.

One or more example embodiments of the present disclosure will be described below in more detail with reference to the accompanying drawings, showing a flash memory device as an example for illustrating structural and operational features. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

Below, example embodiments of the present disclosure will be described using an example PRAM device. But, it is obvious to one skilled in the art that the scope of the present disclosure is not limited to this example. For example, the present disclosure can be applied to variable resistance memories, supporting an overwrite function, such as MRAM, FeRAM, and the like.

A PRAM device according to the example embodiments may include a plurality of segments. Each segment may include a plurality of words. The present PRAM device may perform a wear leveling operation by a segment unit. Accordingly, overhead to a memory system may be reduced as compared with a wear leveling scheme performed according to a word unit. This is because the amount of write information necessary to be managed is reduced. Further, it is possible to manage the degree of wear between words by shifting words in a segment.

Figure 1:
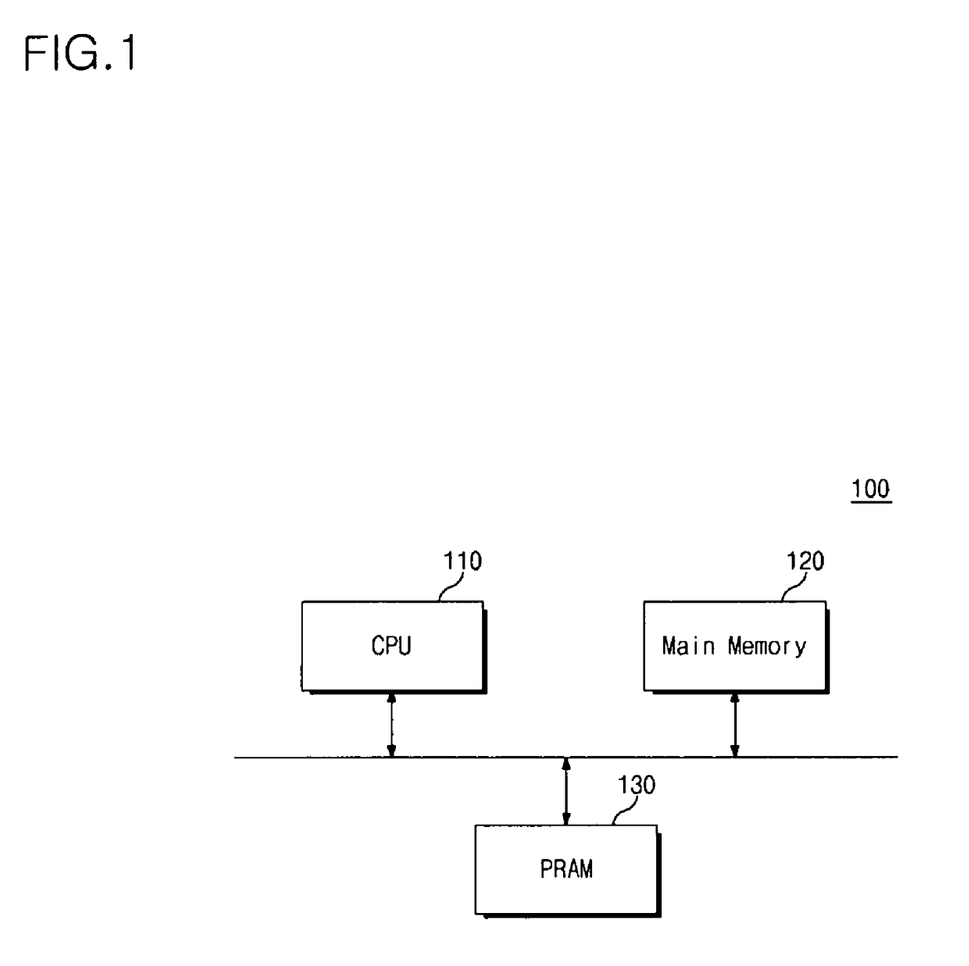
FIG. 1 is a block diagram showing a memory system according to an example embodiment.

FIG. 1 is a block diagram showing a memory system according to an embodiment. Referring to FIG. 1, the memory system 100 may include, for example, a central processing unit (CPU) 110, a main memory 120, and a PRAM device 130. A solid line indicates a system bus for transferring data and commands.

The PRAM device 130 is a non-volatile memory device and is used to store data. Even when power is turned off, data stored in the PRAM device 130 is not lost. Data stored in the PRAM device 130 is loaded in the main memory 120, and the loaded data is then processed by the CPU 110. Data processed by the CPU 110 is stored in the PRAM 130.

Figure 2:
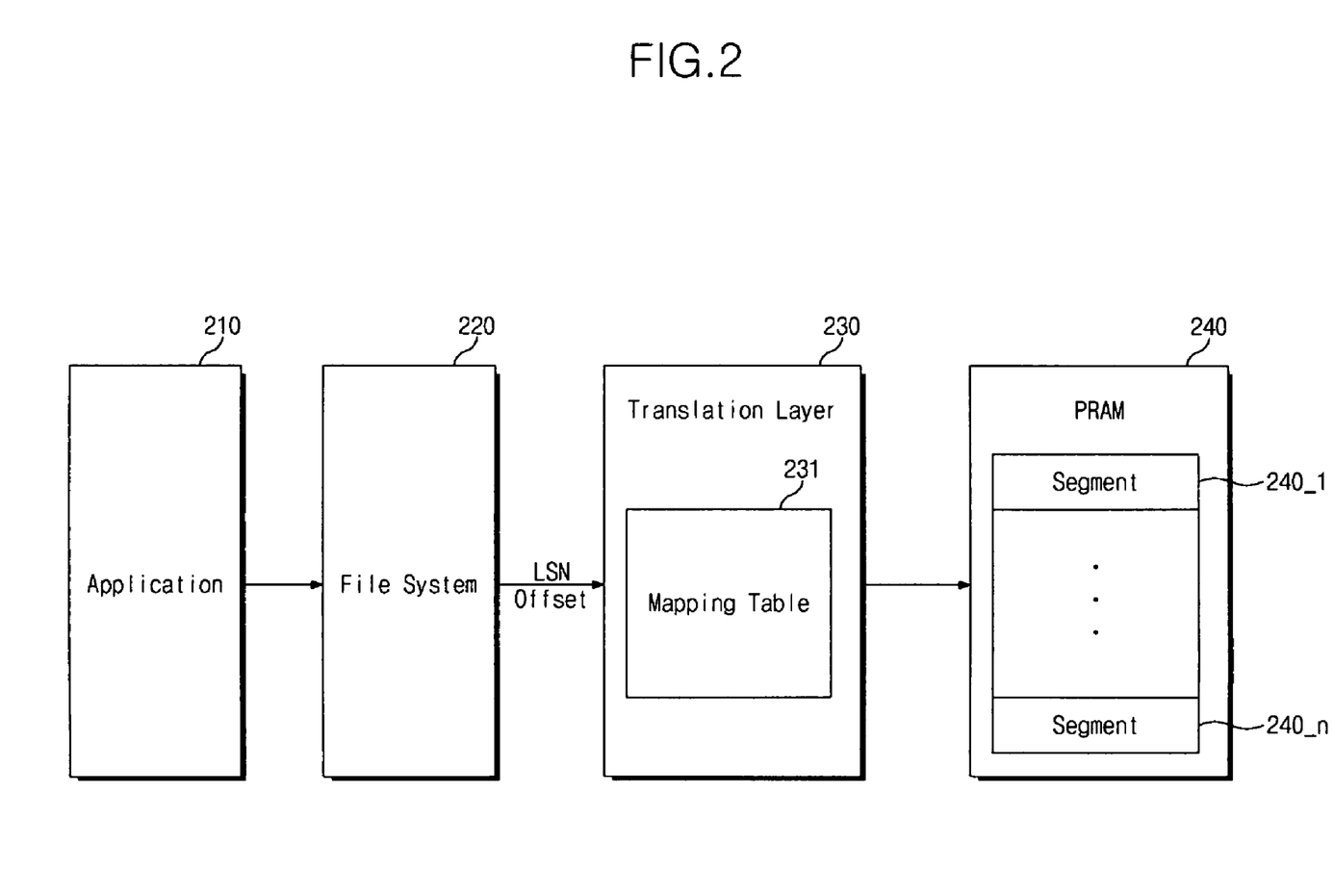
FIG. 2 is a block diagram showing a software layer structure of a memory system illustrated in FIG. 2.

FIG. 2 is a block diagram showing a software layer structure of a memory system illustrated in FIG. 2. Referring to FIG. 2, a memory system may have a software layer structure which includes, for example, application 210, file system 220, translation layer 230, and PRAM device 240.

The PRAM device 240 may include a plurality of segments 240_1 to 240_n. As will be described below in more detail, each segment may include a plurality of words. The PRAM device 240 may perform an input/output operation by/according to a word unit. In order to access a word in the PRAM device 240, information is needed indicating whether the word is included in any segment and further information is needed indicating whether the segment is placed somewhere. The former information is called a segment number and the latter information is called an offset number. The segment number indicates a segment, and the offset number indicates a word in a segment. For example, assuming that a segment number is 3 and an offset number is 5, a $5^{th}$ word in a $3^{rd}$ segment is denoted.

Segment and offset numbers are able to be transferred to the translation layer 230 from the file system 220, respectively. Further, the segment and offset numbers are able to be transferred to the translation layer 230 from the file system 220 at the same time. For example, in a case where a segment and offset number 26 are transferred to the translation layer 230 from the file system 220, the translation layer 230 divides the number 26 by a word number in a segment (e.g., 5). Herein, a quotient indicates a segment number, and a remainder indicates an offset number. Since a quotient is 5 and a remainder is 1, in a case were 26 is divided by 5, there is denoted a first word in a $5^{th}$ segment.

The application 210, the file system 220, and the translation layer 230 are loaded on the main memory 120 (refer to FIG. 1 as an example) and then executed by CPU 110 (refer to FIG. 1 as an example). The application 210 may process data in response to an input of user. The application 210 processes data and transfers to the file system 220 a command for storing the processed data. The file system 220 transfers a Logical Segment Number (LSN) and an offset number to the translation layer 230 in response to a command from the application 210. The translation layer 230 selects a word in the PRAM device 240 with reference to the logical segment number LSN and the offset number. In order to perform such functions, the translation layer 230 refers to a mapping table 231. A format of the mapping table 231 will be described more fully with reference to FIG. 4.

Figure 3:
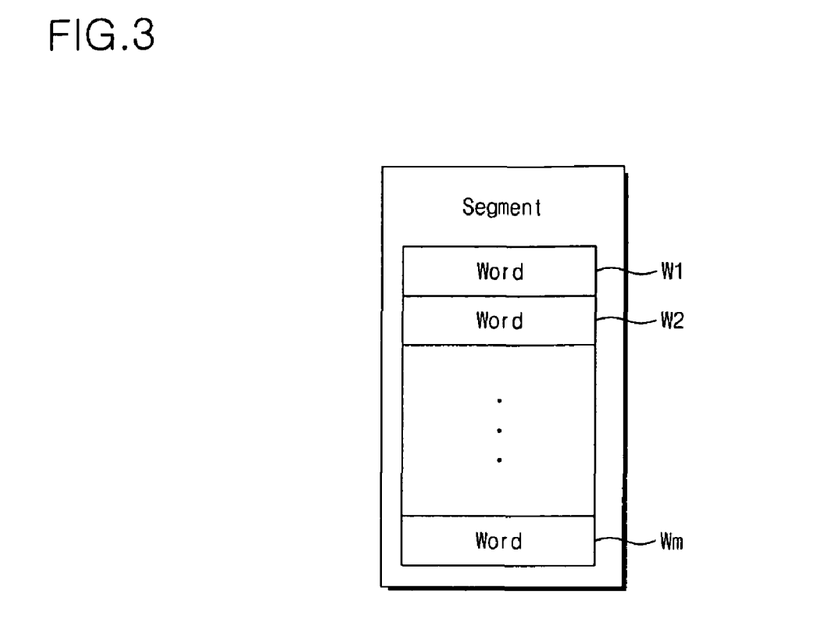
FIG. 3 is a diagram showing a segment structure of a PRAM device illustrated in FIG. 2.

FIG. 3 is a diagram showing a segment structure of a PRAM device illustrated in FIG. 2. Referring to FIG. 3, a segment includes a plurality of words W1 to Wm. A PRAM device 240 (refer to FIG. 2 as an example) may perform an input/output operation according to a word unit. Thus, each word may be worn differently than any other word. In example embodiments of the present disclosure it is assumed that a word size is 2-bytes. However, a word size may be increased or reduced at need.

The current embodiment may manage the degree of wear according to a segment unit. As described above, in the case of managing the degree of wear according to a word unit, since a write count of each word is managed, the amount of overhead may be signficantly increased in a memory system. In the case of the current embodiment, since the degree of wear is managed according to a segment unit, overhead of the memory system is reduced. But, in this case, the degrees of wear between words in a segment may be different from one another. Accordingly, in example embodiments, words in a segment are shifted whenever segments are exchanged. This enables unbalance of the degrees of wear between words in a segment to be mitigated. An operation of shifting words will be more fully described with reference to FIG. 7.

Figure 4:
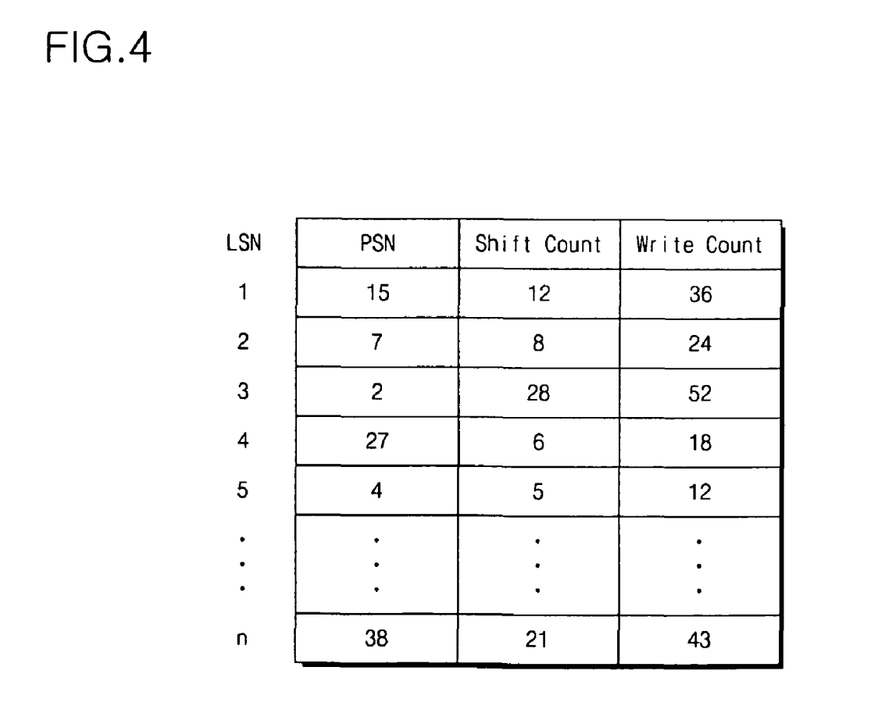
FIG. 4 is a diagram showing a mapping table structure illustrated in FIG. 2.

FIG. 4 is a diagram showing a mapping table structure illustrated in FIG. 2. Referring to FIG. 4, a mapping table may include a logical segment number LSN, a physical segment number PSN, a shift count, and a write count. Each logical segment number LSN corresponds to the physical segment number, the shift count, and the write count.

The shift count is information indicating whether words in a physical segment are shifted by a certain number. The write count indicates a count of write operations to be performed with respect to a physical segment. Further, the write count may be a number of write-requested words. For example, if a write operation is requested with respect to three words in a physical segment, a write count may be increased by 3.

Referring to FIG. 4, a first logical segment LSN1 corresponds to a $15^{th}$ physical segment PSN15, which has a shift count of 12. This means that words in the $15^{th}$ physical segment PSN15 are shifted twelve times. Accordingly, a first word in the $15^{th}$ physical segment PSN15 is placed twelfth. The $15^{th}$ physical segment PSN15 has a write count of 36. This means that thirty-six write operations are performed with respect to the $15^{th}$ physical segment PSN15.

Figure 5:
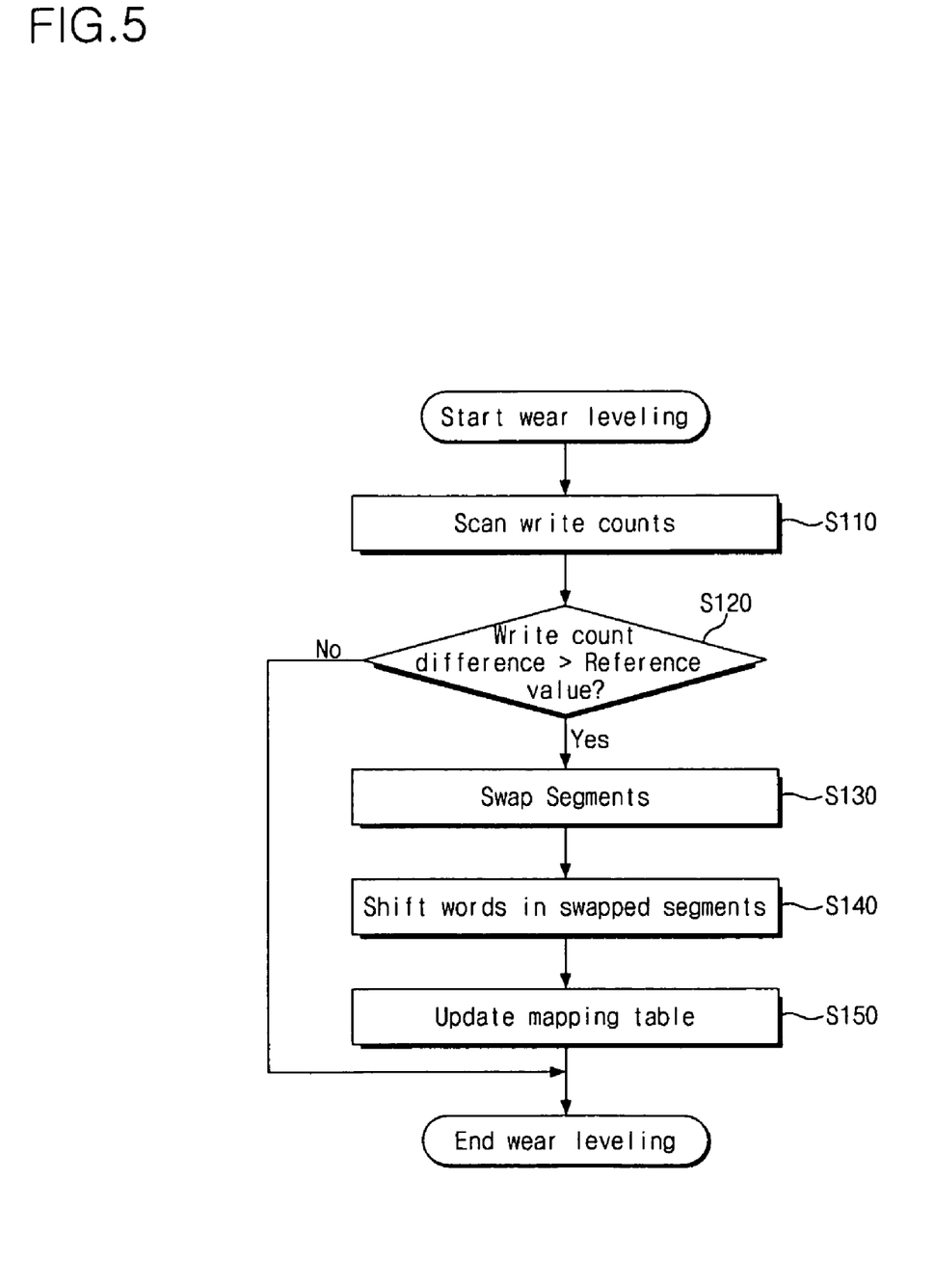
FIG. 5 is a flow chart for describing a wear leveling method according to an example embodiment.

FIG. 5 is a flow chart for describing a wear leveling method according to an embodiment. The wear leveling method according to the current embodiment may be divided into five operations. An executed point of time of the wear leveling method according to the current embodiment may be determined optionally. For example, the wear leveling method according to the current embodiment may be executed after a write operation is performed with respect to a PRAM device 240 (refer to FIG. 2).

In operation S110, a translation layer 230 (refer to FIG. 2) scans a write count of each of the physical segments with reference to a mapping table 231 (refer to FIG. 2).

In operation S120, the translation layer 230 judges whether a difference between the maximum write count and the minimum write count is greater than a reference value. That is, the translation layer 230 compares the reference value with a write count difference obtained by subtracting the minimum write count from the maximum write count. If the write count difference is below the reference value, the wear leveling operation is not executed. That is, the wear leveling operation is ended. On the other hand, if the write count difference is greater than the reference value, the procedure goes to operation S130. The reference value may be set to any value at need. For example, the reference value may be set to have a lower value in order to reduce the write count difference.

In operation S130, the translation layer 230 swaps data stored in a physical segment having a maximum write count with data stored in a physical segment having a minimum write count. The physical segment having the maximum write count is judged to be worn relatively more than the segment having the minimum write count, and the physical segment having the minimum write count is judged to be worn relatively less than the segment having the maximum write count. Further, data stored in the physical segment having the maximum write count is judged to be updated relatively frequently, and data stored in the physical segment having the minimum write count is judged to be updated relatively rarely.

With the swap operation, frequently updated data is stored in the least worn-out physical segment, and rarely updated data is stored in the most worn-out physical segment. Thus, the degree of wear between physical segments may be uniformly maintained.

In operation S140, the translation layer 230 shifts words in the swapped physical segments. Although the degree of wear between physical segments becomes uniform, the degree of wear between words in a physical segment is not uniform. For this reason, in the case of the current embodiment, whenever physical segments are swapped, words in each physical segment are shifted to maintain the degree of wear between words uniformly. This will be more fully described with reference to FIG. 7.

In operation S150, the translation layer 230 updates the mapping table 231. Since data stored in physical segments is exchanged in operation S130, it is necessary to update correspondence between logical segment numbers and physical segment numbers in the mapping table 231. Since words between physical segments are shifted in operation S140, a shift count may be increased, and a write count of each physical segment may be increased.

A wear leveling method of a memory system according to the current embodiment is executed as described above. In other words, a PRAM device according to the current embodiment may include a plurality of segments, each of which includes a plurality of words. The PRAM device according to the current embodiment may execute a wear leveling operation according to a segment unit. Thus, it is possible to reduce overhead of a memory system as compared with a wear leveling method executed according to a word unit. This is because the amount of write counts to be managed is reduced. Further, it is possible to manage the degree of wear between words by shifting words in a physical segment.

Figure 6:
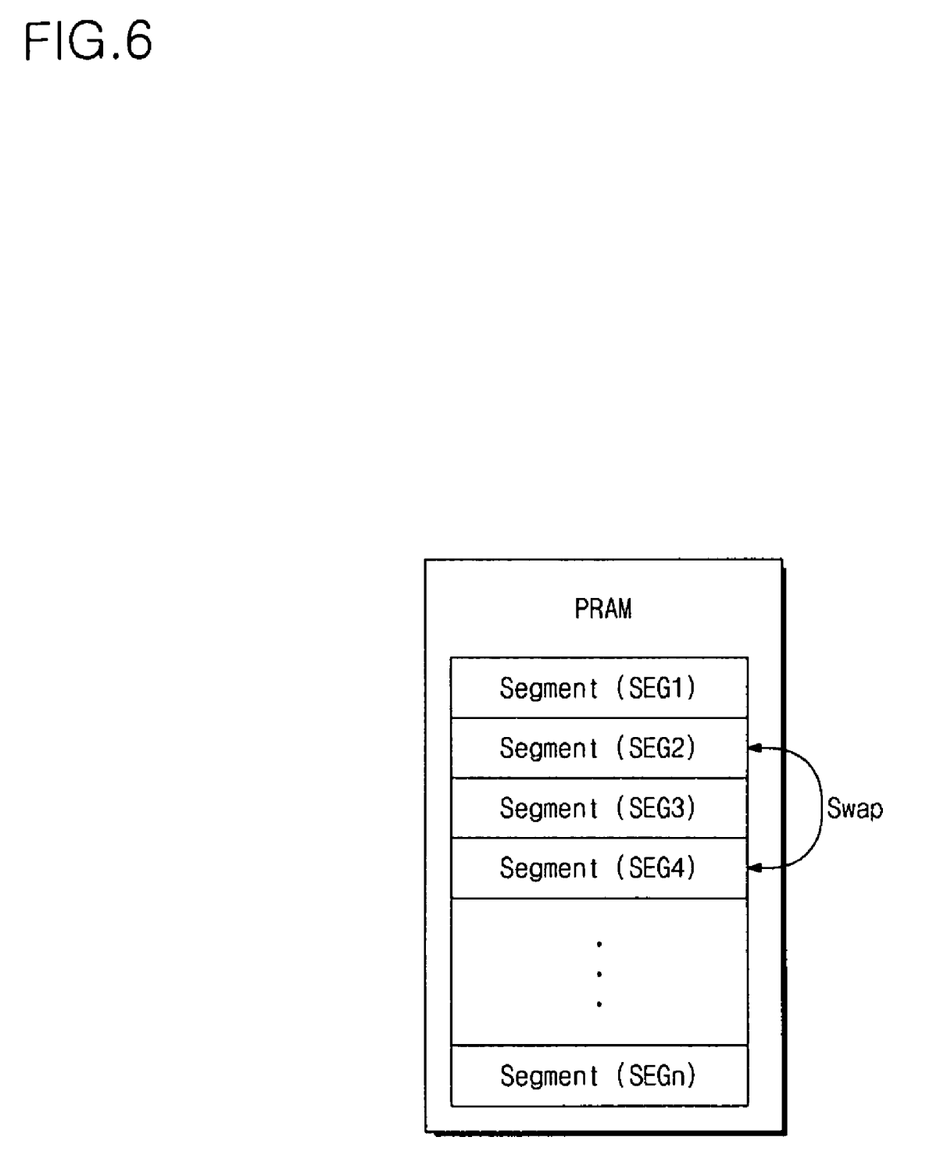
FIG. 6 is a block diagram for describing a physical segment exchanging operation in FIG. 5.

FIG. 6 is a block diagram for describing a physical segment exchanging operation in FIG. 5. Referring to FIG. 6, it is assumed that a second physical segment SEG2 has the maximum write count and a fourth physical segment SEG4 has the minimum write count. A translation layer 230 stores data of the second physical segment SEG2 into the fourth physical segment SEG4. In this case, since data stored in the fourth physical segment SEG4 is erased due to overwriting, it is temporarily stored in a separate storage region (e.g., a buffer). The translation layer 230 then stores data in a buffer (not shown) into the second physical segment SEG2. Accordingly, data may be exchanged between physical segments via the above-described procedure.

According to the above description, data stored in the second physical segment SEG2 is stored in the fourth physical segment SEG4 and vice-versa. But, it is obvious to one skilled in the art that the data storing order can be changed. It is possible to maintain the degree of wear between physical segments by swapping physical segments as described above.

Figure 7:
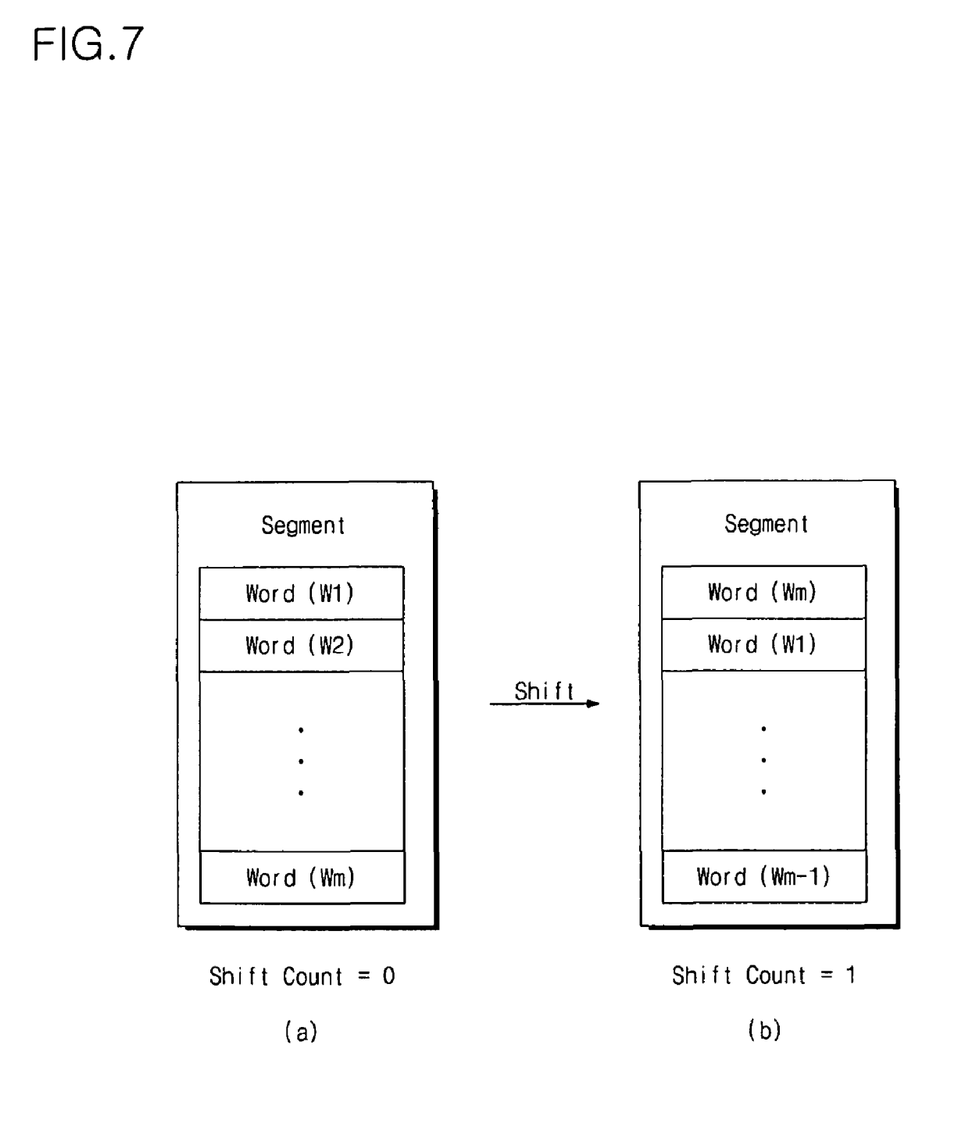
FIG. 7 is a block diagram for describing a word shift operation in FIG. 5.

FIG. 7 is a block diagram for describing a word shift operation in FIG. 5. FIG. 7(a) shows a segment including words before shifting, and FIG. 7(b) shows a segment including words after shifting once.

Referring to FIG. 7(a), a physical segment may include a plurality of words W1 to Wm. Since words are not shifted, a shift count is '0'. This means that a first word W1 is placed at a first position of a physical segment. In this case, an offset number transferred from a file system 220 (refer to FIG. 2) may indicate a word position. For example, if an offset number is '3' and a shift count is '0', a third word in a corresponding physical segment may be denoted.

Referring to FIG. 7(b), since words are shifted once, a shift count is '1'. This means that a first word W1 is located at a second position of a physical segment. That is, a value obtained by adding an offset number from the file system 220 to '1' indicates a word position. For example, when an offset number is '3' and a shift count is '1', a fourth word in a physical segment is denoted.

A shift count is increased whenever a shift operation is performed. If a shift count is more than the number of words of a physical segment, a division (mod) operation may be executed. For example, assuming that a physical segment includes ten words and a shift count is 25, 5 is obtained by a division operation. This means that a first word is located at a fifth position of a physical segment. With the above-described shift operation, it is possible to uniformly maintain the degree of wear between words of a physical segment.

Figure 8:
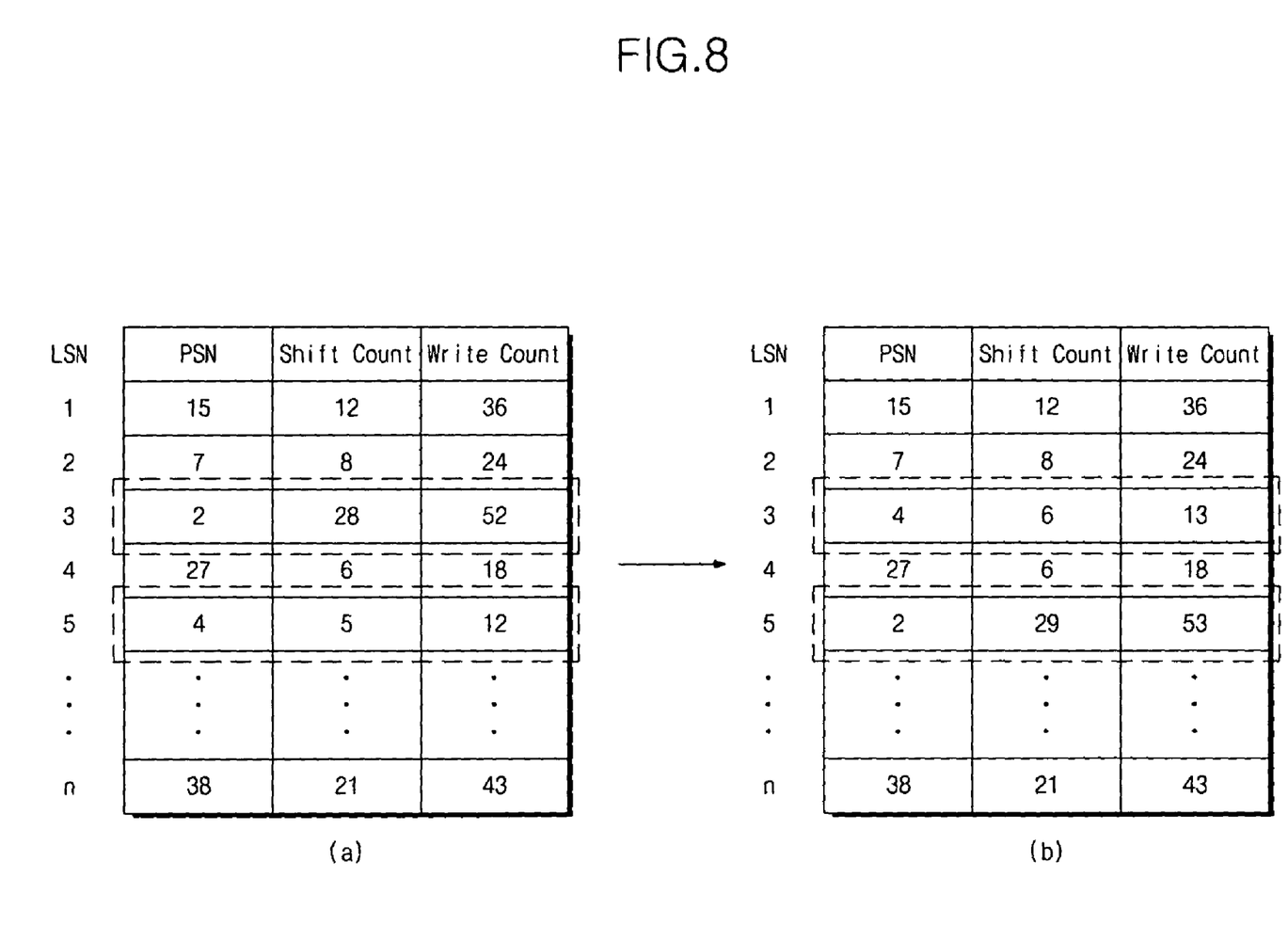
FIG. 8 is a diagram for describing a mapping table updating operation in FIG. 5.

FIG. 8 is a diagram for describing a mapping table updating operation in FIG. 5. FIG. 8(a) shows a mapping table before updating, and FIG. 8(b) shows a mapping table after updating. In example embodiments, it is assumed that a second physical segment PSN2 has the maximum write count and a fourth physical segment PSN4 has the minimum write count. Further, it is assumed that a reference value is 40. Thus, a wear leveling operation is executed when a write count difference between the maximum write count and the minimum write count is over 40.

Referring to FIG. 8(a), a second physical segment PSN2 corresponds to a third logical segment LSN3. A shift count of the second physical segment PSN2 is 28, and a write count thereof is 52. A fourth physical segment PSN4 corresponds to a fifth logical segment LSN5. A shift count of the fourth physical segment PSN4 is 5, and a write count thereof is 12. A write count difference between the write counts of the second and fourth physical segments PSN2 and PSN4 is 40. That is, the write count difference is identical with the reference value. Thus, data in the second physical segment PSN2 is swapped with data in the fourth physical segment PSN4.

FIG. 8(b) shows a mapping table updated according to a swap operation of data stored in physical segments. Referring to FIG. 8(b), the second physical segment PSN2 corresponds to a fifth logical segment LSN5. A shift count of the second physical segment PSN2 is increased to 29 from 28. This is because words in a physical segment are shifted at a swap operation. A write count of the second physical segment PSN2 is increased to 53 from 52. This is done according to a swap operation of physical segments.

A fourth physical segment PSN4 corresponds to a third logical segment LSN3. A shift count of the fourth physical segment PSN4 is increased to 6 from 5. This is because words in a physical segment are shifted in a swap operation. A write count of the fourth physical segment PSN4 is increased to 13 from 12. This is done according to a swap operation of physical segments.

As described above, it is possible to make the degree of wear between physical segments more uniform by swapping data in a physical segment having a maximum write count with data in a physical segment having a minimum write count. Data stored in the physical segment having the maximum write count is judged to be data that is frequently updated. Thus, it is possible to make the degree of wear between physical segments more uniform by storing the frequently updated data in the least worn-out physical segment. Further, it is possible to make the degree of wear between words more uniform by shifting words in segments.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A memory system comprising:
   a variable resistance memory configured to input and output data by a first unit; and
   a translation layer for managing the degree of wear of the variable resistance memory by a second unit different from the first unit;
   wherein the translation layer includes a mapping table which stores mapping information of a plurality of segments of the memory, a write count of each segment, and a shift count of each segment.

2. The memory system of claim 1, wherein the second unit is more than the first unit.

3. The memory system of claim 1, wherein the first unit is a word unit and the second unit is a segment unit including a plurality of words.

4. The memory system of claim 1, wherein the translation layer manages the degree of wear of the variable resistance memory with reference to a write count of each segment.

5. The memory system of claim 4, wherein the translation layer swaps data in a segment having the maximum write count with data in a segment having the minimum write count.

6. The memory system of claim 5, wherein the translation layer updates the mapping information of the plurality of segments in the mapping table when data in segments is swapped.

7. The memory system of claim 5, wherein the translation layer shifts words in each of the swapped segments when data in the segments is swapped.

8. The memory system of claim 7, wherein the translation layer updates a shift count of each segment in the mapping table when words in each of the swapped segments are shifted.

9. The memory system of claim 1, wherein the translation layer detects a write count of each of the segments and swaps data in a segment having the maximum write count with data in a segment having the minimum write count when a write count difference between the maximum write count and the minimum write count is over a reference value.

10. The memory system of claim 9, wherein the reference value is variable.

11. A wear leveling method of a memory system that includes a variable resistance memory having a plurality of segments each including a plurality of words and performing an overwrite operation by a word unit, and a translation layer for leveling the degree of wear of the segments, the wear leveling method comprising:
    detecting wear information of each of the segments; and
    swapping data in the segments according to the detected wear information.

12. The wear leveling method of claim 11, further comprising:
    shifting words in each of the swapped segments.

13. The wear leveling method of claim 11, wherein the translation layer manages the degree of wear of the variable resistance memory with reference to a write count of each of the segments.

14. The wear leveling method of claim 13, wherein the translation layer swaps data in a segment having the maximum write count with data in a segment having the minimum write count.

15. The wear leveling method of claim 13, wherein the translation layer detects a write count of each of the segments and swaps data in a segment having the maximum write count with data in a segment having the minimum write count when a write count difference between the maximum write count and the minimum write count is over a reference value.

* * * * *